United States Patent
Chen et al.

(10) Patent No.: US 12,113,076 B2
(45) Date of Patent: Oct. 8, 2024

(54) METHOD FOR MANUFACTURING DISPLAY SUBSTRATE, DISPLAY SUBSTRATE AND DISPLAY DEVICE

(71) Applicants: Hefei BOE Display Technology Co., Ltd., Anhui (CN); BOE TECHNOLOGY GROUP CO., LTD., Beijing (CN)

(72) Inventors: Liang Chen, Beijing (CN); Jincheng Gao, Beijing (CN); Haijiao Qian, Beijing (CN); Tao Jiang, Beijing (CN); Zexu Liu, Beijing (CN); Tao Wang, Beijing (CN); Lixing Zhao, Beijing (CN); Guanyong Zhang, Beijing (CN); Quanzhou Liu, Beijing (CN); Jiantao Liu, Beijing (CN)

(73) Assignees: HEFEI BOE DISPLAY TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 421 days.

(21) Appl. No.: 17/514,265

(22) Filed: Oct. 29, 2021

(65) Prior Publication Data
US 2022/0302180 A1    Sep. 22, 2022

(30) Foreign Application Priority Data
Mar. 19, 2021    (CN) .......................... 202110298554.4

(51) Int. Cl.
*H01L 27/12* (2006.01)
*H01L 21/311* (2006.01)
(52) U.S. Cl.
CPC .... *H01L 27/1248* (2013.01); *H01L 21/31116* (2013.01); *H01L 21/31138* (2013.01); *H01L 27/1262* (2013.01); *H01L 27/124* (2013.01)

(58) Field of Classification Search
CPC ............ H01L 21/31116; H01L 27/1248; H01L 21/31138; H01L 27/1262; H01L 27/124;
(Continued)

(56) References Cited

U.S. PATENT DOCUMENTS

2004/0266041 A1* 12/2004 Kim ....................... H01L 27/12
                                                      438/30
2011/0193076 A1    8/2011 Yun et al.
(Continued)

FOREIGN PATENT DOCUMENTS

CN    107170754 A    9/2017
CN    109709734 A    5/2019

OTHER PUBLICATIONS

Office action from Chinese Application No. 202110298554.4 dated Jun. 17, 2022.

*Primary Examiner* — Mouloucoulaye Inoussa
(74) *Attorney, Agent, or Firm* — Calfee, Halter & Griswold LLP

(57) ABSTRACT

Embodiments of the disclosure provide a display substrate and a method for manufacturing the same. The display substrate includes: a base substrate; a thin film transistor including a source-drain metal layer and a first insulating layer; a second insulating layer; a color resist layer; and a third insulating layer. The third insulating layer comprises a first via hole that sequentially penetrates the third insulating layer, the color resist layer and the second insulating layer and thus extends from the third insulating layer to the source-drain metal layer. A sidewall of the first via hole comprises a first portion formed of a material of the second insulating layer, a second portion formed of a material of the color resist layer, and a third portion formed of a material of the third insulating layer, the second portion is between the first portion and the third portion.

9 Claims, 9 Drawing Sheets

(58) Field of Classification Search
CPC ............ H01L 27/1225; H01L 29/7869; H01L 27/1244; H01L 27/1255; G02F 1/133512; G02F 1/13394; G02F 1/1339; G02F 1/1368; G02F 1/13439; G02F 1/136286; G02F 1/136227; G02F 1/136222; G02F 1/13398; G02F 1/13338; G02F 1/136277; G02F 1/136213; G02F 1/134309; G02F 1/133555; G02F 1/134363; G02F 1/134372; G02F 1/133397; G02F 2203/01; G02F 2202/16; G02F 2201/121; G11C 19/28; G09G 3/3677; G09G 2310/0297; G09G 2310/0286; G09G 2310/0291; H10K 71/611; H10K 99/00; H10K 50/80; H10K 59/122; H10K 59/131; H10K 71/00; H10K 50/824; H10K 50/828; H10K 59/00; H10K 59/1201
USPC ....... 257/43, 309; 349/138, 40, 43; 438/107, 438/29
See application file for complete search history.

(56) References Cited

U.S. PATENT DOCUMENTS

| | | | |
|---|---|---|---|
| 2013/0071973 A1* | 3/2013 | Beak | G02F 1/136227 438/158 |
| 2013/0149818 A1* | 6/2013 | Jung | H01L 29/66742 438/158 |
| 2013/0222723 A1* | 8/2013 | Kim | G02F 1/136209 349/40 |
| 2014/0159059 A1* | 6/2014 | Jeong | G02F 1/133707 438/22 |
| 2014/0175432 A1* | 6/2014 | Yamazaki | H01L 27/1255 257/43 |
| 2015/0060973 A1* | 3/2015 | Tsai | G02F 1/136213 257/309 |
| 2017/0293186 A1* | 10/2017 | Kim | G02F 1/1368 |
| 2018/0314105 A1* | 11/2018 | Shu | G02F 1/133512 |
| 2018/0337446 A1 | 11/2018 | Nakazawa et al. | |

* cited by examiner

METHOD FOR MANUFACTURING DISPLAY SUBSTRATE, DISPLAY SUBSTRATE AND DISPLAY DEVICE

RELATED APPLICATION

The present application claims the benefit of Chinese Patent Application No. 202110298554.4 filed on Mar. 19, 2021, the entire disclosure of which is incorporated herein by reference.

TECHNICAL FIELD

The present disclosure relates to the field of display technologies, especially to a method for manufacturing a display substrate, a display substrate and a display device.

BACKGROUND

In the process for preparing a color resist layer on the array substrate, a metal at the bottom of a pixel via hole suffers from serious oxidation, which leads to an increase in the contact resistance between the pixel electrode and the drain electrode, resulting in poor display.

SUMMARY

As an aspect of the disclosure, an embodiment provides a display substrate comprising: a base substrate; a thin film transistor structure on the base substrate, the thin film transistor structure comprising a source-drain metal layer and a first insulating layer; a second insulating layer on a side of the thin film transistor structure facing away the base substrate; a color resist layer on a side of the second insulating layer facing away the base substrate; a third insulating layer on a side of the color resist layer facing away the base substrate. The third insulating layer comprises a first via hole, and the first via hole sequentially penetrates the third insulating layer, the color resist layer and the second insulating layer and thus extends from the third insulating layer to the source-drain metal layer, wherein a sidewall of the first via hole comprises a first portion formed of a material of the second insulating layer, a second portion formed of a material of the color resist layer, and a third portion formed of a material of the third insulating layer, wherein the second portion is between the first portion and the third portion.

According to some embodiments, the thin film transistor structure further comprises a gate metal layer between the source-drain metal layer and the base substrate, the third insulating layer further comprises a second via hole, the second via hole sequentially penetrates the third insulating layer, the color resist layer, the second insulating layer and a part of the first insulating layer and thus extends from the third insulating layer to the gate metal layer to expose at least a part of the gate metal layer.

According to some embodiments, the color resist layer has a thickness ranging from 1.0 µm to 2.0 µm; the first insulating layer has a thickness ranging from 3500 angstroms to 4500 angstroms; and the second insulating layer has a thickness ranging from 800 angstroms to 1200 angstroms.

According to some embodiments, the display substrate further comprises a pixel electrode on the third insulating layer, the pixel electrode extends along the sidewall of the first via hole to come into contact with the source-drain metal layer.

According to some embodiments, the display substrate further comprises a common electrode on the third insulating layer, the common electrode extends along a sidewall of the second via hole to come into contact with the gate metal layer.

Another embodiment of the disclosure provides a display device comprising the display substrate according to any one of the foregoing embodiments.

Yet another embodiment of the disclosure provides a method for manufacturing a display substrate, comprising: forming a thin film transistor structure on a base substrate, the thin film transistor structure comprising a gate metal layer, a first insulating layer, and a source-drain metal layer; forming a second insulating layer on a side of the thin film transistor structure facing away the base substrate; forming a color resist layer and a third insulating layer successively on a side of the second insulating layer facing away the base substrate, the third insulating layer comprising a first via hole and a second via hole, so that at least one of a material of the color resist layer and a material of the third insulating layer is comprised between a bottom of the first via hole and the second insulating layer, and an orthographic projection of the first via hole on the base substrate at least partially overlaps an orthographic projection of the source-drain metal layer on the base substrate, the second via hole penetrates the third insulating layer and the color resist layer to expose a part of the second insulating layer, and an orthographic projection of the second via hole on the base substrate at least partially overlaps an orthographic projection of the gate metal layer on the base substrate; and performing an etching process in the first via hole and the second via hole, so that the first via hole extends to the source-drain metal layer to expose at least a part of the source-drain metal layer, and the second via hole extends to the gate metal layer to expose at least a part of the gate metal layer.

According to some embodiments, the forming the color resist layer and the third insulating layer successively on the side of the second insulating layer facing away the base substrate comprises: forming the color resist layer on the side of the second insulating layer facing away the base substrate, the color resist layer comprising a third via hole, the third via hole exposing at least a part of the second insulating layer, and an orthographic projection of the third via hole on the base substrate at least partially overlapping an orthographic projection of the gate metal layer on the base substrate; and forming the third insulating layer on a side of the color resist layer facing away the base substrate, so that the first via hole exposes a part of the color resist layer, and the second via hole penetrates the third via hole to expose a part of the second insulating layer.

According to some embodiments, during a process of forming the color resist layer on the side of the second insulating layer facing away the base substrate, a portion of the color resist layer corresponding to the first via hole has a thickness ranging from 1.0 µm to 2.0 µm.

According to some embodiments, the forming the color resist layer and the third insulating layer successively on the side of the second insulating layer facing away the base substrate comprises: forming the color resist layer on the side of the second insulating layer facing away the base substrate, the color resist layer comprising a third via hole and a fourth via hole, the third via hole and the fourth via hole exposing a portion of the second insulating layer, respectively, an orthographic projection of the third via hole on the base substrate at least partially overlapping an orthographic projection of the gate metal layer on the base substrate, and an orthographic projection of the fourth via hole on the base substrate at least partially overlapping an orthographic projection of the source-drain metal layer on the base substrate; and forming the third insulating layer on the side of the color resist layer facing away the base substrate, so that the first via hole does not penetrate the third insulating layer, and the second via hole penetrates the third insulating layer to expose a part of the second insulating layer.

According to some embodiments, during a process of forming the third insulating layer on the side of the color resist layer facing away the base substrate, a portion of the third insulating layer corresponding to the first via hole has a thickness ranging from 1.0 μm to 2.0 μm.

According to some embodiments, the etching process comprises a dry etching process employing an etching gas, the etching gas comprises nitrogen trifluoride and oxygen, and a volume ratio of nitrogen trifluoride to oxygen ranges from 1:1 to 1:3.

According to some embodiments, the source-drain metal layer comprises at least one of a source electrode and a drain electrode, and an orthographic projection of the first via hole on the base substrate at least partially overlaps an orthographic projection of the at least one of the source electrode and the drain electrode on the base substrate, so that the first via hole exposes at least a part of the at least one of the source electrode and the drain electrode.

According to some embodiments, the gate metal layer comprises a common electrode line, and an orthographic projection of the second via hole on the base substrate at least partially overlaps an orthographic projection of the common electrode line on the base substrate, so that the second via hole exposes at least a part of the common electrode line.

The above summary is only for illustrative purposes and is not intended to be limiting in any way. In addition to the exemplary aspects, embodiments and features described above, by referring to the accompanying drawings and the following detailed description, further aspects, embodiments and features of the technical solutions provided by the embodiments of the disclosure will be easy to appreciate.

BRIEF DESCRIPTION OF DRAWINGS

In the drawings, unless otherwise specified, the same reference numerals denote the same or similar components or elements throughout multiple drawings. The drawings are not necessarily drawn to scale. It should be understood that these drawings only depict some embodiments according to the present disclosure, and should not be regarded as limiting the scope of the present disclosure.

FIG. 1B is an electron micrograph showing the first via hole in the display substrate shown in FIG. 1a;

FIGS. 3 to 7a illustrate schematic views of partial structures during the process of manufacturing a display substrate according to another embodiment of the disclosure;

FIG. 8b is an electron micrograph showing the fifth via hole in the display substrate shown in FIG. 8a;

DETAILED DESCRIPTION OF EMBODIMENTS

Figure 1A:
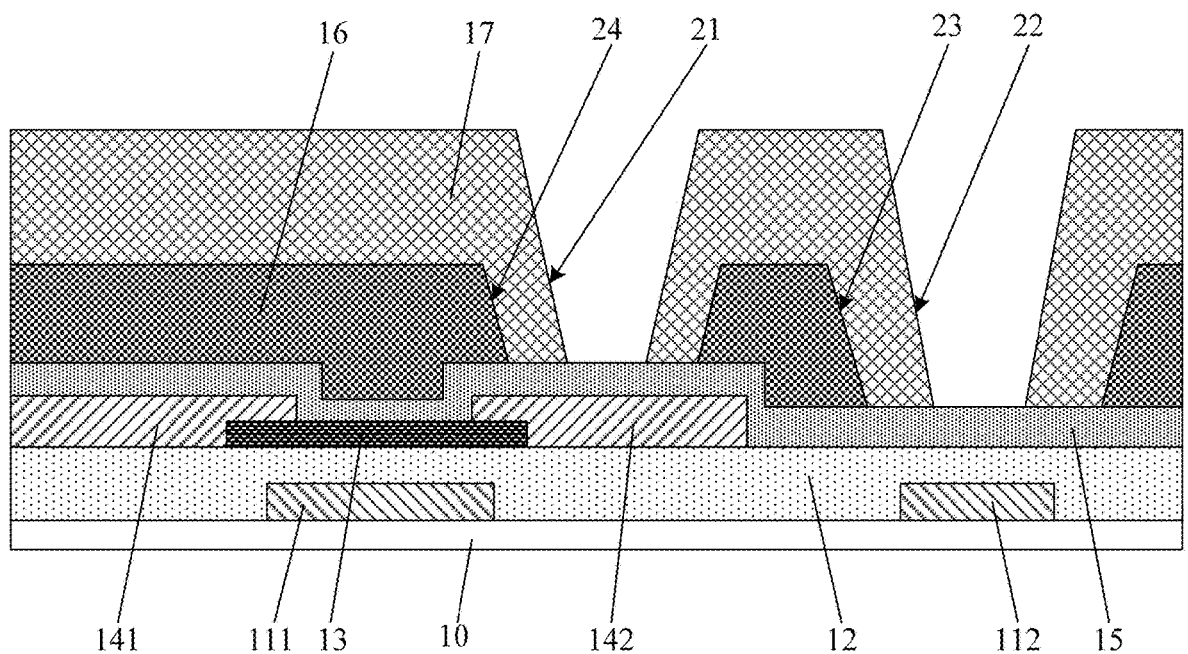
FIG. 1a is a schematic structural view of a display substrate according to an embodiment of the disclosure during the process of preparing via holes.

Only some exemplary embodiments are briefly described below. As those skilled in the art can realize, the described embodiments may be modified in various different ways without departing from the spirit or scope of the disclosure. Therefore, the drawings and description are regarded to be essentially illustrative and not restrictive.

The following reference numerals will be mentioned below:
10 base substrate; 111 gate electrode; 112 common electrode line; 12 first insulating layer; 13 active layer; 141 source electrode; 142 drain electrode; 15 second insulating layer; 16 color resist layer; 17 third insulating layer; 181 pixel electrode; 182 common electrode; 21 first via hole; 22 second via hole; 23 third via hole; 24 fourth via hole; 25 fifth via hole; 26 sixth via hole.

Figure 1B:
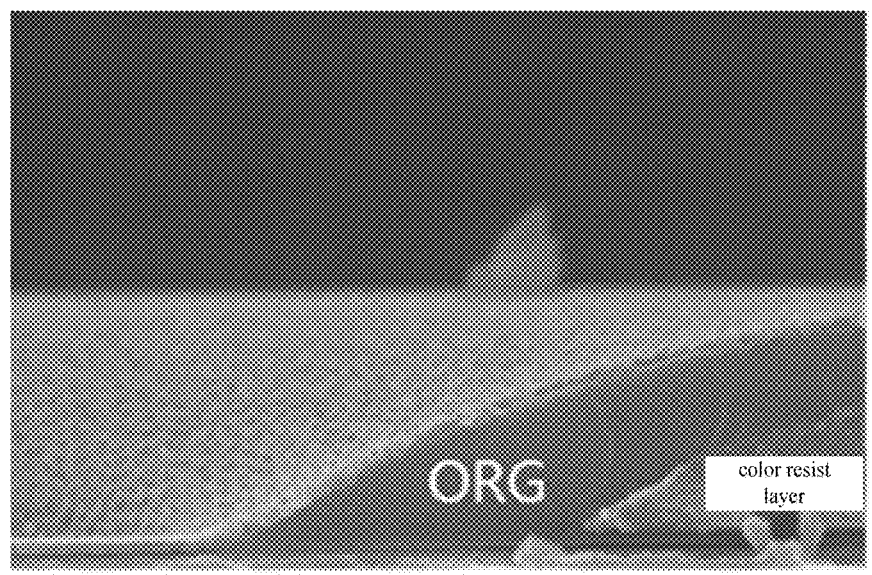

FIG. 1a is a schematic structural view of a display substrate during the process of preparing via holes. FIG. 1B is an electron micrograph showing the position of the first via hole in the display substrate shown in FIG. 1a. In this embodiment, as shown in FIG. 1a, the display substrate may comprise a base substrate 10 and a thin film transistor structure on the base substrate 10. The thin film transistor structure comprises a gate metal layer on a side of the base substrate 10, a first insulating layer 12 (also called a gate insulating layer GI) on a side of the gate metal layer facing away the base substrate, an active layer 13 on a side of the first insulating layer 12 facing away the base substrate, and a source-drain metal layer on a side of the active layer 13 facing away the base substrate. The gate metal layer may comprise a gate electrode 111, a gate line (not shown), and a common electrode line 112. The source-drain metal layer may comprise a source electrode 141, a drain electrode 142, and a data line (not shown).

As shown in FIG. 1a, the display substrate may comprise a second insulating layer 15 (also called a passivation layer PVX), a color resist layer 16 and a third insulating layer 17 (also called an organic material layer ORG). In the display substrate shown in FIG. 1, the color resist layer 16 may be called a color filter structure layer, and the color resist layer 16 may comprise a red color resist, a green color resist, and a blue color resist. The color resist layer 16 is used to enable each pixel to generate light of a respective color. The second insulating layer 15 is located on a side of the source-drain metal layer facing away the base substrate 10. The color resist layer 16 is located on a side of the second insulating layer 15 facing away the base substrate 10, and the color resist layer 16 comprises a third via hole 23 and a fourth via hole 24. The third via hole 23 and the fourth via hole 24 both expose the second insulating layer 15. The orthographic projection of the third via hole 23 on the base substrate 10 does not overlap the orthographic projection of the source-drain metal layer on the base substrate 10, and the orthographic projection of the third via hole 23 on the base substrate 10 at least partially overlaps the orthographic projection of the common electrode line 112 in the gate metal layer on the base substrate 10. The orthographic projection of the fourth via hole 24 on the base substrate 10 at least partially overlaps the orthographic projection of the drain electrode 142 in the source-drain metal layer 14 on the base substrate 10.

The third insulating layer 17 is located on a side of the color resist layer 16 facing away the base substrate 10, and the third insulating layer 17 comprises a first via hole 21 and a second via hole 22. The first via hole 21 penetrates the fourth via hole 24, so that the second insulating layer 15 is exposed through the first via hole 21, as shown in FIGS. 1a and 1b. The orthographic projection of the first via hole 21 on the base substrate 10 at least partially overlaps the orthographic projection of the drain electrode 142 on the base substrate 10. The second via hole 22 penetrates the third via hole 23, so that the second insulating layer 15 is exposed through the second via hole 22. The orthographic projection of the second via hole 22 on the base substrate 10 at least partially overlaps the orthographic projection of the common electrode line 112 in the gate metal layer on the base substrate 10.

Figure 2:
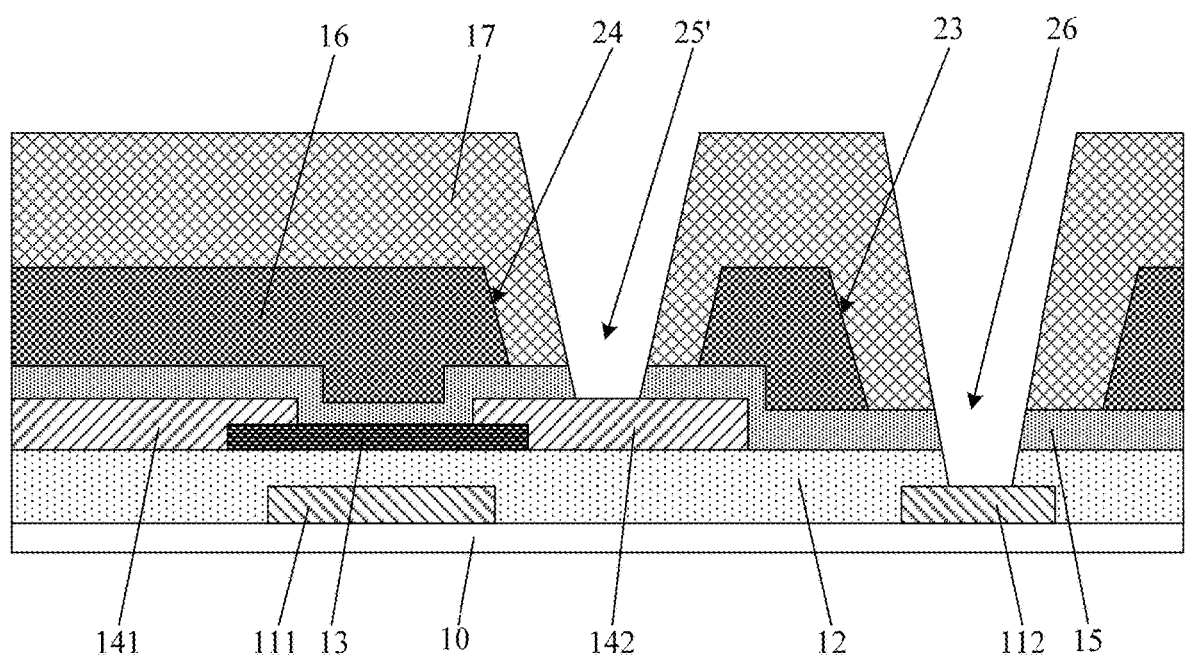
FIG. 2 is a schematic structural view of the display substrate shown in FIG. 1a after an etching process is performed.

FIG. 2 is a schematic structural view of the display substrate shown in FIG. 1a after being etched. As shown in FIGS. 1a and 2, a thickness of the second insulating layer 15 may be 1000 angstroms, and a thickness of the first insulating layer 12 may be 4000 angstroms. The insulating layers at the first via hole 21 and the second via hole 22 may be etched simultaneously using an etching process, which removes the second insulating layer 15 in the first via hole 21 to expose the drain electrode 142, and removes the second insulating layer 15 and the first insulating layer 12 in the second via hole 22 to expose the common electrode line 112. During the etching process, only the second insulating layer 15 needs to be etched away at the first via hole 21, and the second insulating layer 15 and the first insulating layer 12 need to be etched away at the second via hole 22. The thickness of the second insulating layer 15 is much smaller than the sum of the thicknesses of the second insulating layer 15 and the first insulating layer 12, that is, the thickness of the film layer that needs to be etched away at the first via hole 21 is much smaller than that of the film layer that needs to be etched away at the second via hole 22. Therefore, the drain electrode 142 at the first via hole 21 is exposed earlier than the common electrode line 112 at the second via hole 22, which will result in serious oxidation of the drain electrode 142, influence the contact resistance between the drain electrode 142 and a pixel electrode to be formed subsequently, and eventually lead to poor display.

Figure 3:
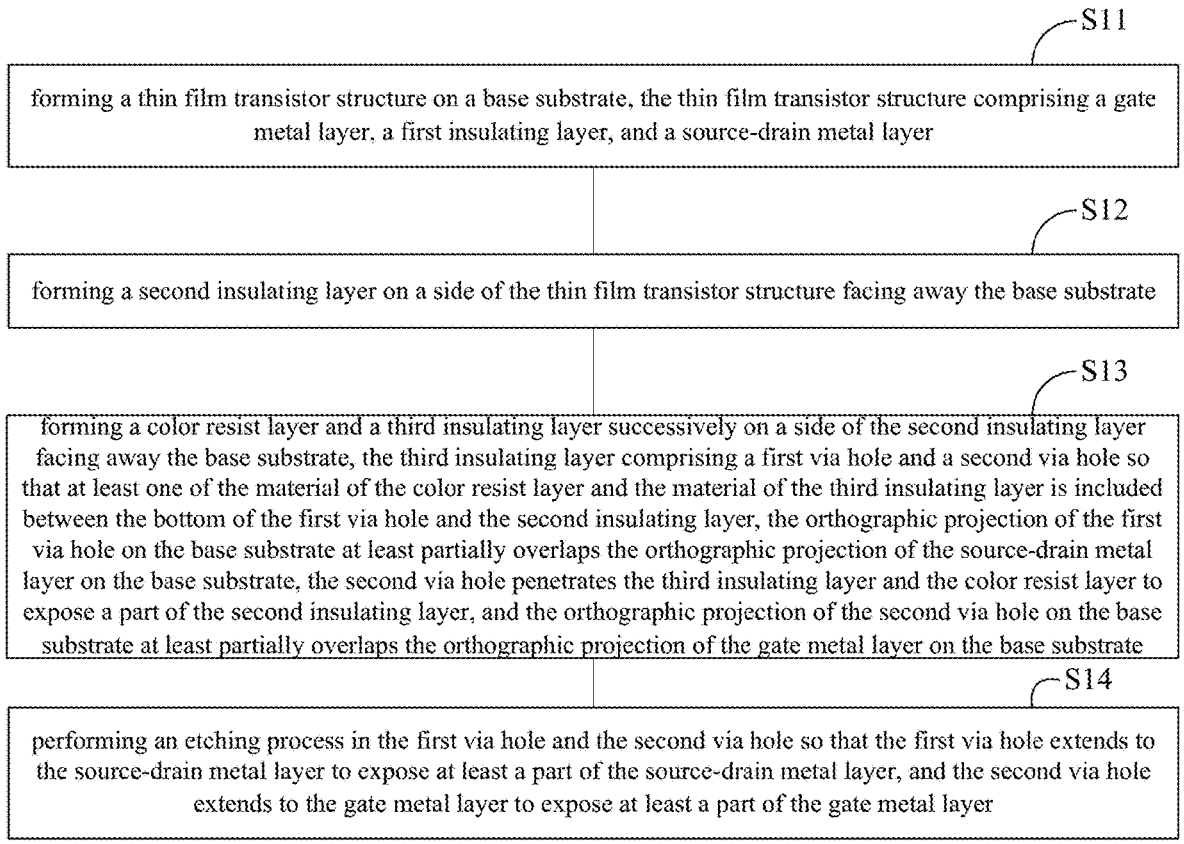

FIG. 3 is a flow chart of a method for manufacturing a display substrate according to another embodiment of the present disclosure. As shown in FIG. 3, the method for manufacturing a display substrate may comprise: S11, forming a thin film transistor structure on a base substrate, the thin film transistor structure comprising a gate metal layer, a first insulating layer, and a source-drain metal layer; S12, forming a second insulating layer on a side of the thin film transistor structure facing away the base substrate; S13, forming a color resist layer and a third insulating layer successively on a side of the second insulating layer facing away the base substrate, the third insulating layer comprising a first via hole and a second via hole, so that at least one of the material of the color resist layer and the material of the third insulating layer is included between the bottom of the first via hole and the second insulating layer, the orthographic projection of the first via hole on the base substrate at least partially overlaps the orthographic projection of the source-drain metal layer on the base substrate, the second via hole penetrates the third insulating layer and the color resist layer to expose a part of the second insulating layer, and the orthographic projection of the second via hole on the base substrate at least partially overlaps the orthographic projection of the gate metal layer on the base substrate; S14, performing an etching process in the first via hole and the second via hole, so that the first via hole extends to the source-drain metal layer to expose at least a part of the source-drain metal layer, and the second via hole extends to the gate metal layer to expose at least a part of the gate metal layer.

According to the technical solution of the embodiment of the disclosure, during the process of performing an etching process in the first via hole and the second via hole so that the first via hole extends to the source-drain metal layer, and the second via hole extends to the gate metal layer, the material of the color resist layer and/or the third insulating layer and the material of the second insulating layer need to be etched away at the first via hole, and the materials of the second insulating layer and the first insulating layer need to be etched away at the second via hole. Compared with the embodiment shown in FIG. 2, the difference between the thicknesses of the film layers that need to be etched away at the first via hole and the second via hole is greatly reduced, which can avoid premature exposure of the metal at the first via hole, prevent the metal at the first via hole from being seriously oxidized, reduce the influence on the contact resistance, and increase the product yield.

The technical solution of the embodiment of the present disclosure will be described in detail below by means of more specific examples. It can be understood that, regarding "patterning" mentioned herein, when the patterned material is an inorganic material or metal, "patterning" includes photoresist coating, mask exposure, development, etching, photoresist stripping and other processes. When the patterned material is an organic material, "patterning" includes mask exposure, development and other processes. The evaporation, deposition, coating, etc. mentioned herein are all mature manufacturing processes in the related arts.

Figure 4:
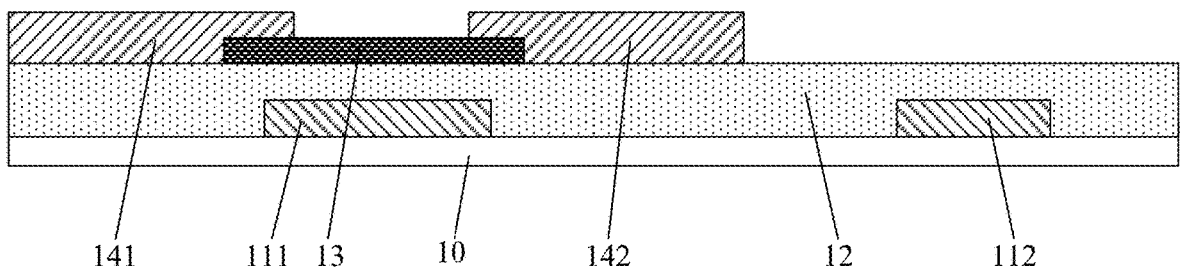

S11, forming a thin film transistor structure on the base substrate 10, as shown in FIG. 4, which illustrates a schematic view of a thin film transistor structure in the substrate. The formation of a thin film transistor may comprise the following processes.

A gate metal layer is formed on a side of the base substrate 10, and the gate metal layer may include a gate electrode 111, a gate line (not shown), and a common electrode line 112, as shown in FIG. 4. By way of example, a gate metal film may be deposited on the base substrate 10, and the gate metal film is patterned to form a gate metal layer.

A first insulating layer 12 is formed on a side of the gate metal layer facing away the base substrate 10. By way of example, a first insulating film may be deposited on a side of the gate metal layer facing away the base substrate 10 to form the first insulating layer 12. The material of the first insulating layer 12 may include at least one selected from a group consisting of silicon oxide, silicon nitride and silicon oxynitride. The thickness of the first insulating layer 12 may range from 3500 angstroms to 4500 angstroms, for example 4000 angstroms.

An active layer 13 is formed on a side of the first insulating layer 12 facing away the base substrate 10. The active layer 13 may be formed by conventional techniques, which will not be described here. A source-drain metal layer is formed on a side of the active layer 13 facing away the base substrate 10. The source-drain metal layer may include a source electrode 141, a drain electrode 142 and a data line (not shown). The source-drain metal layer may be formed by conventional techniques in the art, which will not be described here.

Figure 5:
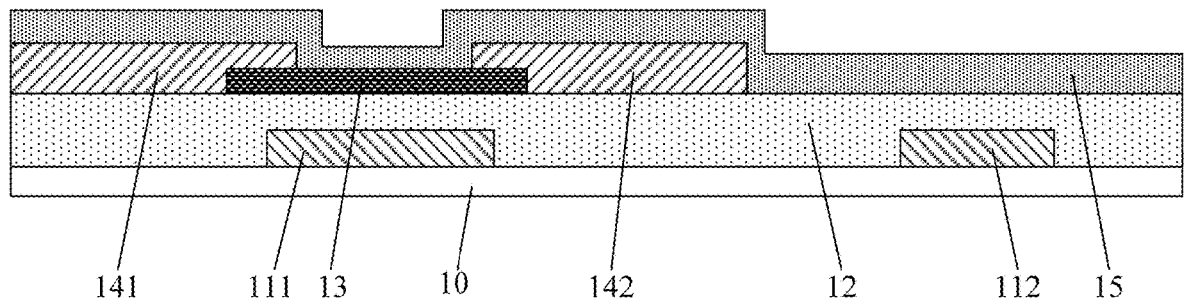

S12, forming a second insulating layer 15 on a side of the thin film transistor structure facing away the base substrate 10, as shown in FIG. 5, which is a schematic view of a display substrate according to an embodiment of the present disclosure where the second insulating layer has been formed. The second insulating layer 15 may be called a passivation layer (PVX), and the material of the second insulating layer 15 may include at least one of silicon oxide, silicon nitride and silicon oxynitride. The thickness of the second insulating layer 15 may range from 800 angstroms to 1200 angstroms, for example, 1000 angstroms.

S13, forming a color resist layer and a third insulating layer successively on a side of the second insulating layer facing away the base substrate. In an embodiment, this step may comprise the following S1311 and S1312.

Figure 6:
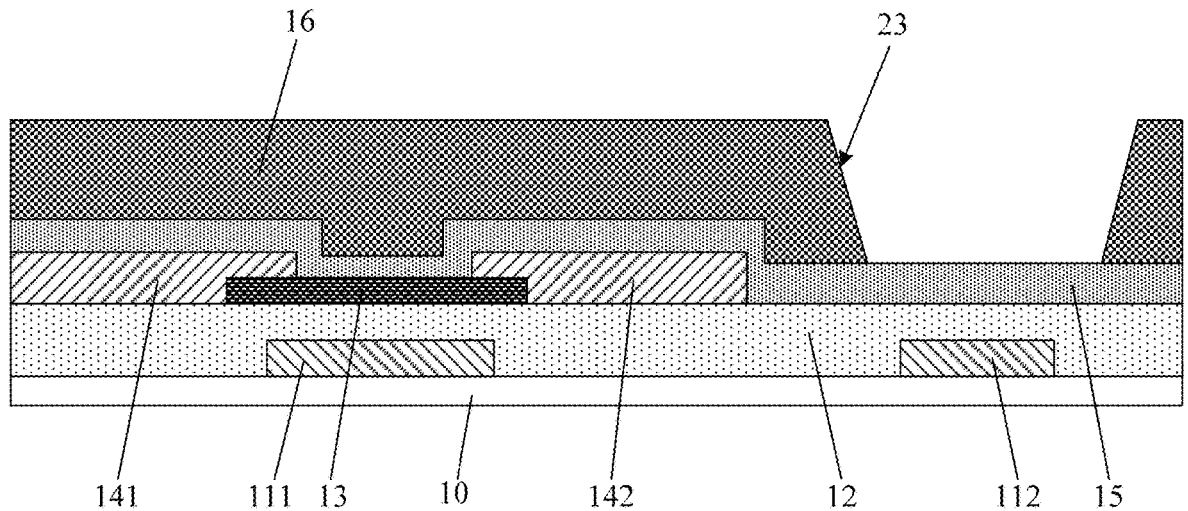

S1311, forming a color resist layer 16 on a side of the second insulating layer 15 facing away the base substrate 10. The color resist layer 16 includes a third via hole 23. The third via hole 23 exposes at least a part of the second insulating layer, and the orthographic projection of the third via hole on the base substrate at least partially overlaps the orthographic projection of the gate metal layer on the base substrate, as shown in FIG. 6, which is a schematic view of a display substrate according an embodiment of the present disclosure where the color resist layer has been formed. By way of example, the orthographic projection of the third via hole 23 on the base substrate 10 at least partially overlaps the orthographic projection of the common electrode line 112 in the gate metal layer on the base substrate 10.

By way of example, the color resist layer 16 may include a red color resist, a green color resist, and a blue color resist, so that a pixel emits light of a respective color. The material of the color resist layer 16 may include an organic material.

By way of example, a color resist film may be coated on a side of the second insulating layer 15 facing away the base substrate 10, and the color resist film is patterned to form the color resist layer 16. The thickness of the color resist layer 16 may range from 1.0 μm to 2.0 μm, which may be any value in the range of 1.0 μm to 2.0 μm. For example, the thickness of the color resist layer 16 may be one of 1.0 μm, 1.2 μm, 1.4 μm, 1.6 μm, 1.8 μm and 2.0 μm.

Figure 7A:
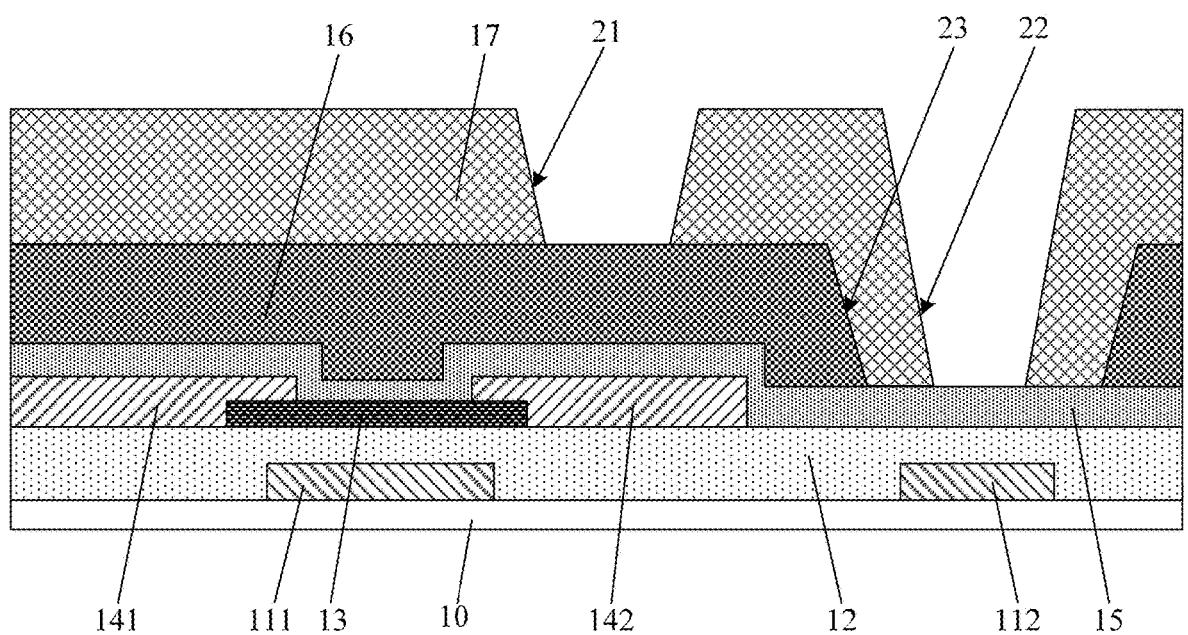

S1312, forming a third insulating layer 17 on a side of the color resist layer 16 facing away the base substrate 10. The third insulating layer 17 includes a first via hole 21 and a second via hole 22. The first via hole 21 exposes a part of the color resist layer 16, and the orthographic projection of the first via hole 21 on the base substrate 10 at least partially overlaps the orthographic projection of the source-drain metal layer on the base substrate. In this case, the first via hole 21 does not enter the color resist layer 16, so the materials of the color resist layer 16 and the second insulating layer 15 are included between the bottom of the first via hole 21 and the source-drain metal layer. The second via hole 22 penetrates the third via hole 23 to expose a part of the second insulating layer 15. The orthographic projection of the second via hole 22 on the base substrate 10 at least partially overlaps the orthographic projection of the common electrode line 112 in the gate metal layer on the base substrate 10, as shown in FIG. 7a, which is a schematic view of a display substrate according to an embodiment of the disclosure where the third insulating layer 17 has been formed.

Figure 7B:
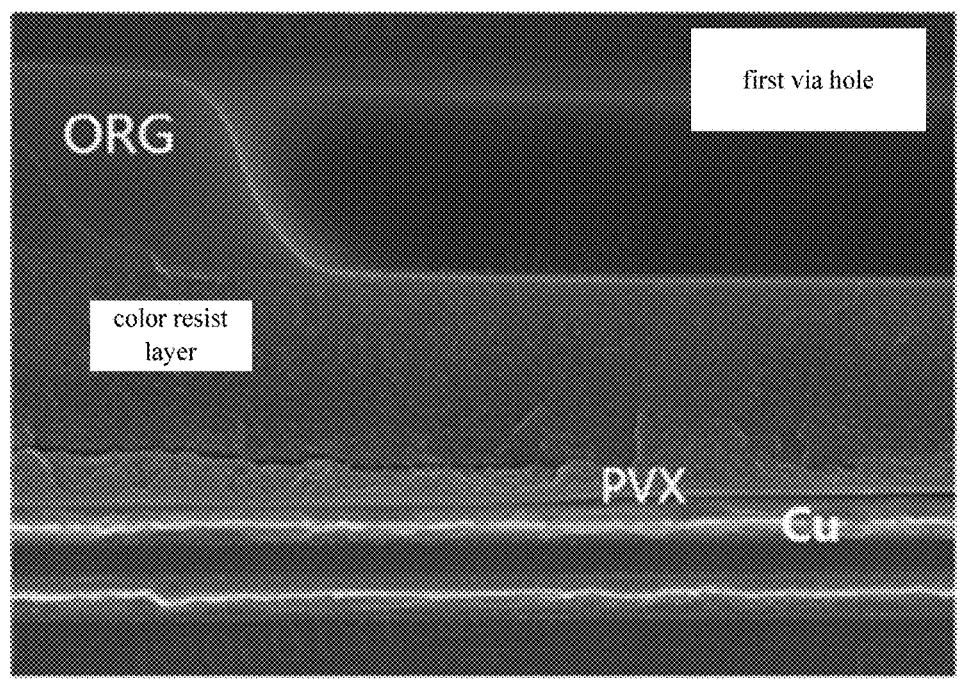
FIG. 7b is an electron micrograph showing the first via hole after the third insulating layer is formed during the process of manufacturing a display substrate according to an embodiment of the disclosure.
Figure 7C:
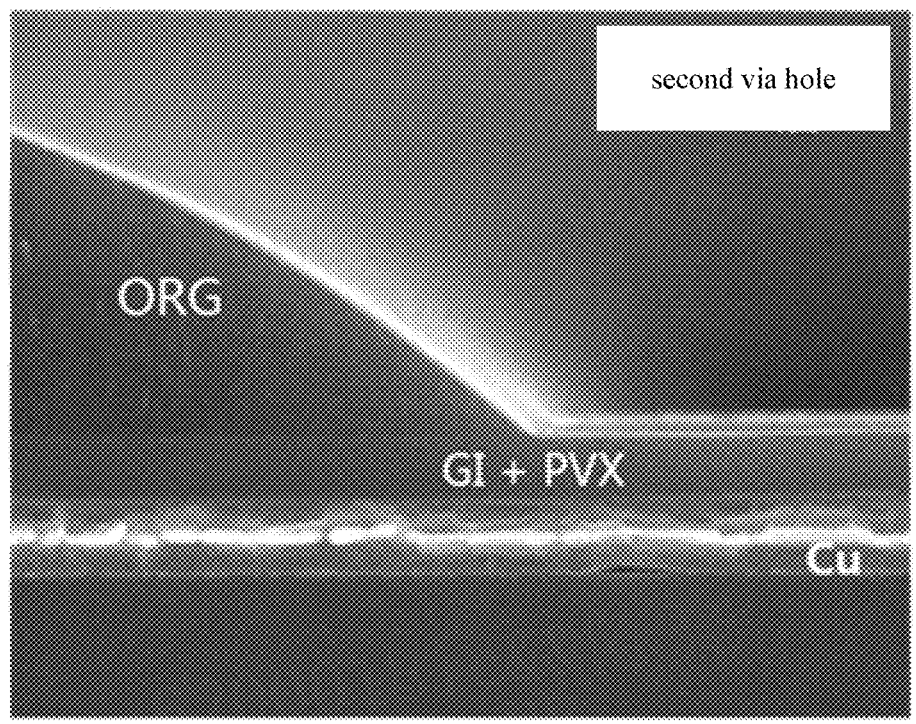
FIG. 7c is an electron micrograph showing the second via hole after the third insulating layer is formed during the process of manufacturing a display substrate according to an embodiment of the disclosure.

FIG. 7b is an electron micrograph of the position of the first via hole 21 where the third insulating layer has been formed in a display substrate according to an embodiment of the disclosure, and FIG. 7c is an electron micrograph of the position of the second via hole 22 where the third insulating layer has been formed in a display substrate according to an embodiment of the disclosure. It can be seen from FIG. 7b that after the third insulating layer is formed, the first via hole exposes the color resist layer. It can be seen from FIG. 7c that after the third insulating layer is formed, the second via hole exposes the second insulating layer (also called the passivation layer PVX). The material of the third insulating layer 17 may include an organic material such as a resin, for example, a photoresist, etc.

By way of example, a photoresist film may be coated on the side of the color resist layer 16 facing away the base substrate 10, and the photoresist film at the first via hole 21 and the photoresist film at the second via hole 22 are subjected to exposure and development to form the first via hole 21 and the second via hole 22, thereby forming the third insulating layer 17.

S14, performing an etching process in the first via hole and the second via hole, so that the first via hole extends to the source-drain metal layer to expose at least a part of the source-drain metal layer, and the second via hole extends to the gate metal layer to expose at least a part of the gate metal layer. In other words, etching is performed at the first via hole and the second via hole, a fifth via hole is formed in the first via hole to expose at least a part of the source-drain metal layer, and a sixth via hole is formed in the second via hole to expose at least a part of the gate metal layer. The fifth via is an extension of the first via hole in the colored layer 16 or the third insulating layer 17, and the second insulating layer 15, and the sixth via hole is an extension of the second via hole in the second insulating layer 15 and the first insulating layer 12. To form the fifth via hole, it is necessary to etch away the color resist layer and the second insulating layer in the first via hole; to form the sixth via hole, it is necessary to remove the second insulating layer and the first insulating layer in the second via hole. In this context, the fifth via hole may be regarded as a part of the final first via hole, and the sixth via hole may be regarded as a part of the final second via hole.

In an embodiment, dry etching may be employed at the first via hole 21 and the second via hole 22 to remove the color resist layer 16 and the second insulating layer 15 in the first via hole 21, so that the fifth via hole 25 in the color resist layer 16 and the second insulating layer 15 is formed. In other words, the first via hole may extend to the source-drain metal layer, and the second insulating layer 15 and the first insulating layer 12 in the second via hole 22 are removed at the same time, forming the sixth via hole 26 in the second insulating layer and the first insulating layer. In other words, the second via hole may extend to the gate metal layer. As a result, at least a part of the source-drain metal layer is exposed through the fifth via hole 25, and at least a part of the gate metal layer is exposed through the sixth via hole 26, as shown in FIG. 8, which is a schematic view of a display substrate according to an embodiment of the disclosure where the fifth via hole and the sixth via hole have been formed by an etching process.

Figure 8A:
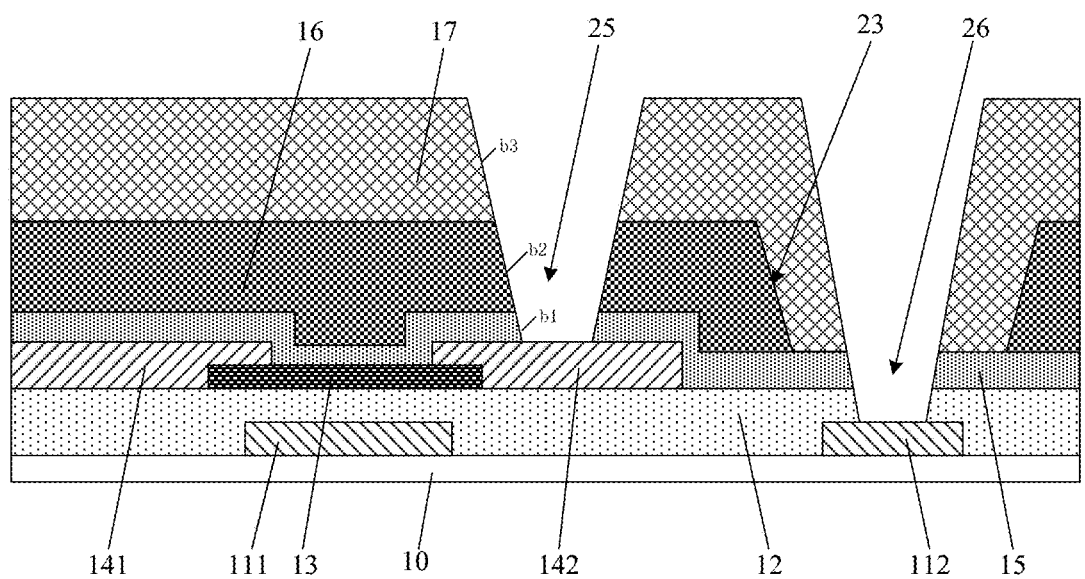
FIG. 8a illustrates a schematic structural view of the display substrate shown in FIG. 7a after an etching process is performed.

In an embodiment, the source-drain metal layer may include a source electrode and a drain electrode, and the orthographic projection of the first via hole 21 on the base substrate 10 may at least partially overlap the orthographic projection of the drain electrode 142 in the source-drain metal layer on the base substrate 10, so that the fifth via hole 25 can expose at least a part of the drain electrode 142, as shown in FIG. 8a. It can be understood that in the thin film transistor, the source electrode and the drain electrode can be interchangeably. In another embodiment, the orthographic projection of the first via hole 21 on the base substrate 10 may at least partially overlap the orthographic projection of the source electrode in the source-drain metal layer on the base substrate 10, so that the fifth via hole can expose at least a part of the source electrode.

In an embodiment, the gate metal layer may include a gate electrode 111 and a common electrode line 112. The orthographic projection of the second via hole 22 on the base substrate 10 may at least partially overlap the orthographic projection of the common electrode line 112 on the base substrate, so that the sixth via hole 26 can expose at least a part of the common electrode line 112, as shown in FIG. 8a.

In an embodiment, the etching gas used during dry etching includes nitrogen trifluoride ($NF_3$) and oxygen ($O_2$), and the volume ratio of nitrogen trifluoride to oxygen is 1:1 to 1:3. For example, the volume ratio of nitrogen trifluoride to oxygen is any value in the range of 1:1 to 1:3, e.g. 1:2. With such a dry etching process, when the color resist layer and the second insulating layer 15 below the first via hole 21 are being etched, a part of the third insulating layer 17 will be etched away at the same time to prevent the fifth via hole 25 (extended first via hole) from being undercut below the third insulating layer 17, so that the first via hole has an overall smooth sidewall, which facilitates good contact between a metal film layer (such as a pixel electrode layer) in the subsequent process and the drain electrode 142 through the first via hole. Similarly, by using the dry etching process, when the second insulating layer 25 and the first insulating layer 12 under the second via 22 are being etched, a part of the third insulating layer 17 will be etched away at the same time to prevent the sixth via hole 26 (extended second via hole) from being undercut under the third insulating layer 17, so that the second via hole has an overall smooth sidewall, which facilitates good contact between a metal film layer (such as a common electrode layer) in the subsequent process and the common electrode line 112 through the second via hole.

Figure 8B:
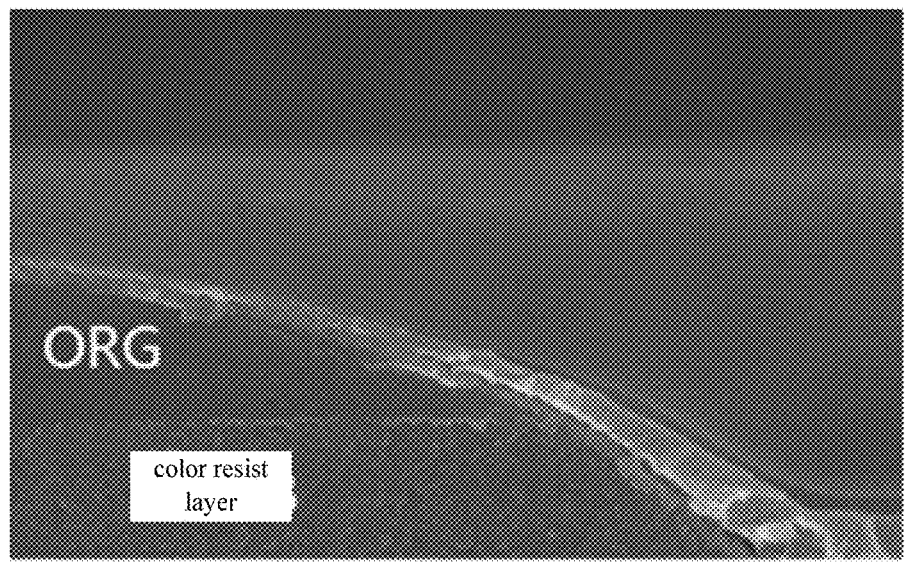

FIG. 8b is an electron micrograph showing the fifth via hole in a display substrate according to an embodiment of the present disclosure after the etching process is performed. It can be seen from FIG. 8b that the first via hole extended through the fifth via hole has a smooth hole wall.

During the process of forming the fifth via hole 25 and the sixth via hole 26, the materials of the color resist layer 16 and the second insulating layer 15 need to be etched away to form the fifth via hole 25, and the materials of the second insulating layer 15 and the first insulating layer 12 need to be etched away to form the sixth via hole 26. Compared with the etching process shown in the embodiment of FIGS. 1 and 2, the film layer that needs to be etched for forming the fifth via hole 25 is thicker than the film layer that needs to be etched for forming the fifth via hole 25' in FIG. 2, so that the etching time is increased. This shortens the time difference between formations of the fifth via hole 25 and the sixth via hole 26 by etching, which can avoid premature exposure of the drain electrode 142, prevent the drain electrode from being seriously oxidized at the fifth via hole, reduce the influence on the contact resistance at the fifth via hole, increase the product yield, and improve the product display effect.

According to some embodiments of the disclosure, the thickness of the color resist layer 16 ranges from 1.0 µm to 2.0 µm, so the thickness of the color resist layer 16 at the first via hole 21 is 1.0 µm to 2.0 µm. For the color resist layer 16 with such a thickness, when the color resist layer in the first via hole is being etched, there is a small difference between the time required for etching away the color resist layer 16 and the second insulating layer 15 and the time required for etching away the second insulating layer 15 and the first insulating layer 12, which can further avoid premature exposure of the drain electrode 142, prevent the drain electrode from being seriously oxidized at the fifth via hole, decrease the influence on the contact resistance at the fifth via hole, increase the product yield, and improve the product display effect.

According to some embodiments of the disclosure, the method for manufacturing a display substrate may further comprise the following step S15.

Figure 9:
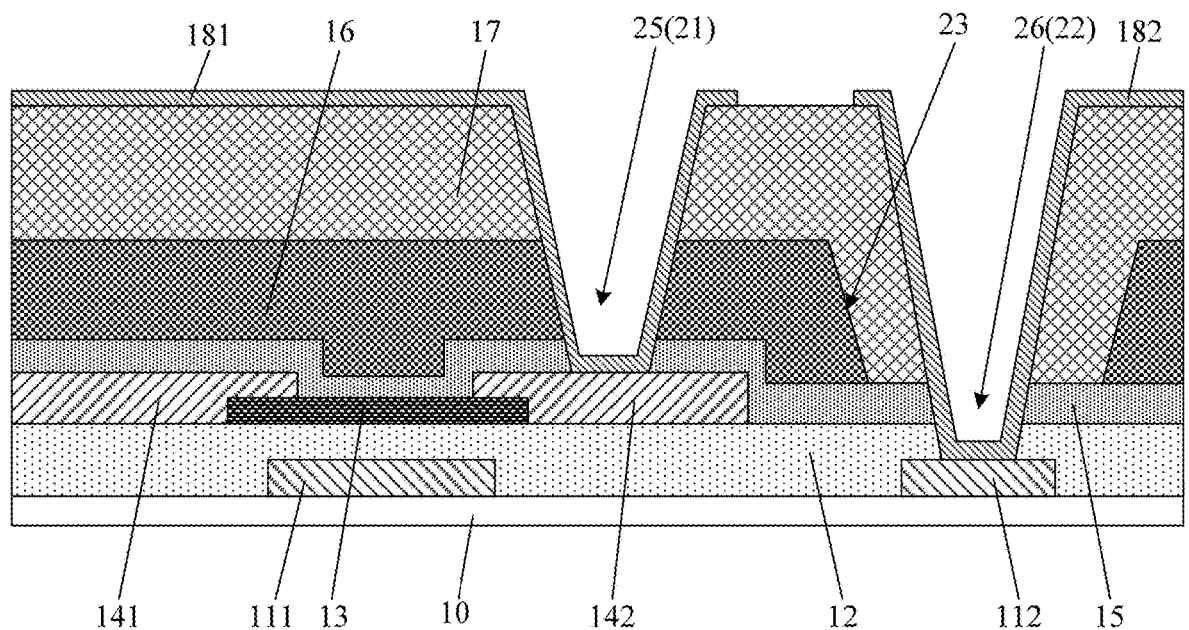
FIG. 9 is a schematic view of a display substrate according to another embodiment of the disclosure after a pixel electrode is formed.

S15, forming a transparent electrode layer on a side of the third insulating layer 17 facing away the base substrate 10. The transparent electrode layer may include a pixel electrode 181 and a common electrode 182. The pixel electrode 181 is connected to the drain electrode 142 through the fifth via hole 25 (extended first via hole 21), and the common electrode 182 is connected to the common electrode line 112 through the sixth via hole 26 (extended second via hole 22), as shown in FIG. 9, which is a schematic view of a display substrate according to an embodiment of the disclosure where the pixel electrode has been formed.

By way of example, a transparent electrode film may be formed on the side of the third insulating layer 17 facing away the base substrate 10, and the transparent electrode film is patterned to form a transparent electrode layer. The transparent electrode layer includes the pixel electrode 181 and the common electrode 182. The pixel electrode 181 is connected to the drain electrode 142 through the first via hole, and the common electrode 182 is connected to the common electrode line 112 through the second via hole. The material of the transparent electrode film may include at least one of indium tin oxide (ITO) and indium zinc oxide (IZO).

Figure 10:
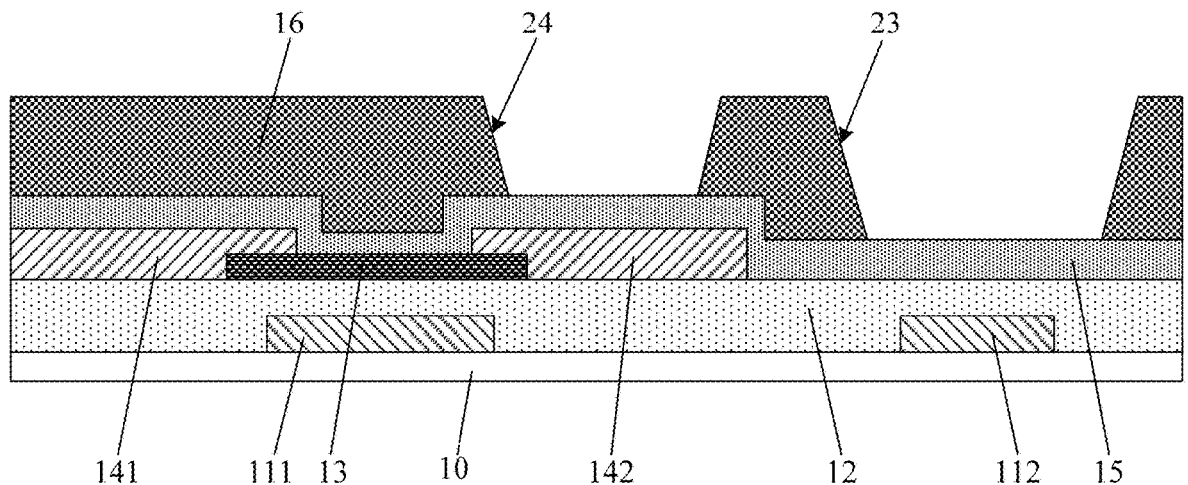
FIGS. 10-12 illustrate partial structural views during the process of manufacturing a display substrate according to a further embodiment of the disclosure.
Figure 11:
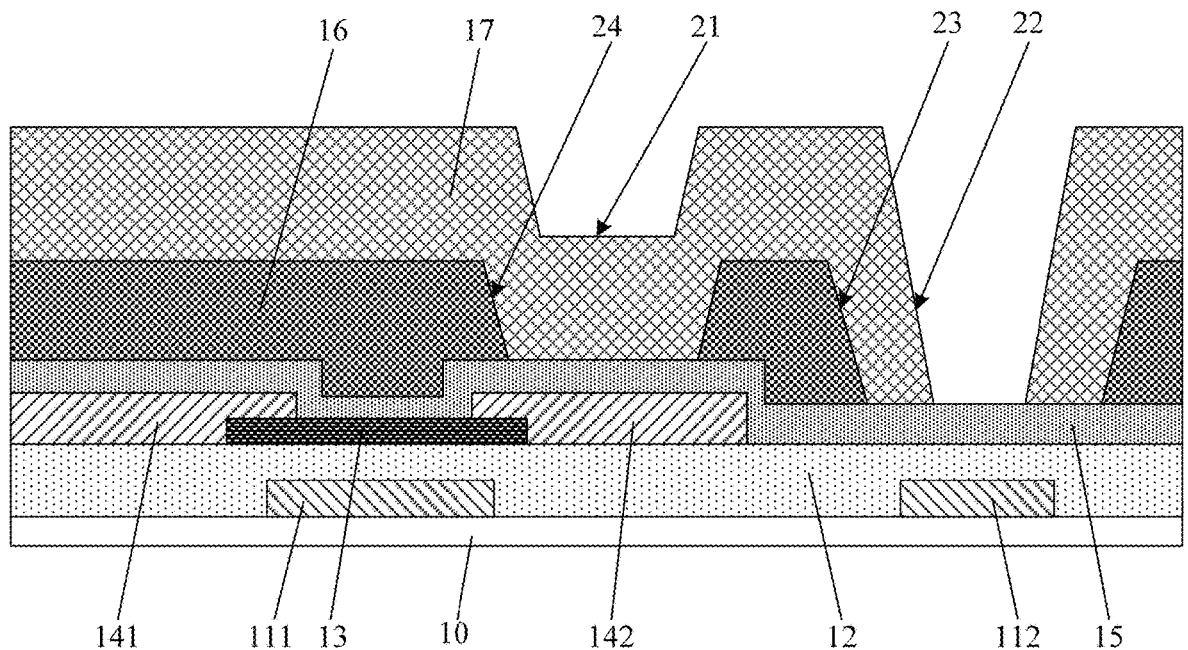
Figure 12:
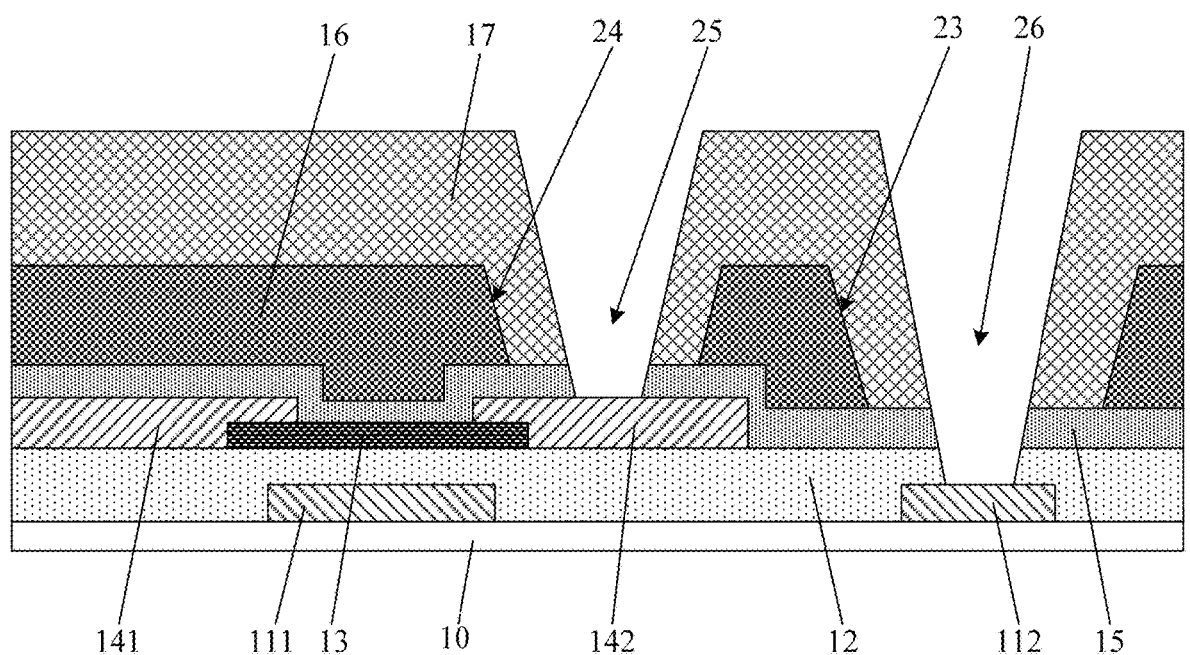

FIGS. 10-12 illustrate partial processes of manufacturing a display substrate according to another embodiment of the disclosure.

In an embodiment, the step of S13, i.e., forming the color resist layer and the third insulating layer successively on the side of the second insulating layer facing away the base substrate may comprise the following steps S1321 and S1322.

S1321, forming a color resist layer 16 on a side of the second insulating layer 15 facing away the base substrate 10. The color resist layer 16 includes a third via hole 23 and a fourth via hole 24. The third via hole 23 and the fourth via hole 24 expose a part of the second insulating layer 15, respectively. The orthographic projection of the third via hole 23 on the base substrate 10 at least partially overlaps the orthographic projection of the common electrode line 112 in the gate metal layer on the base substrate 10, and the orthographic projection of the fourth via hole 24 on the base substrate 10 at least partially overlaps the orthographic projection of the drain electrode 142 in the source-drain metal layer on the base substrate 10, as shown in FIG. 10.

S1322, forming a third insulating layer 17 on a side of the color resist layer 16 facing away the base substrate 10, so that the first via hole does not penetrate the third insulating layer, and the second via hole penetrates the third via hole to expose a part of the second insulating layer. As shown in FIG. 11, the orthographic projection of the first via hole 21 in the third insulating layer 17 on the base substrate 10 at least partially overlaps the orthographic projection of the drain electrode 142 on the base substrate. The depth of the first via hole 21 is less than the thickness of the third insulating layer 17. At that time, the material of the third insulating layer 17 remains between the bottom of the first via hole 21 and the second insulating layer 15, that is, the first via hole 21 does not penetrate the third insulating layer, so that the third insulating layer and the second insulating layer 15 are included between the first via hole 21 and the drain electrode 142. The second via hole 22 penetrates the third via hole 23 to expose the second insulating layer 15. The orthographic projection of the second via hole 22 on the base substrate 10 at least partially overlaps the orthographic projection of the common electrode line 112 in the gate metal layer on the base substrate 10.

The material of the third insulating layer 17 may include an organic material such as a resin, for example, a photoresist, etc.

By way of example, a third insulating film may be coated on the side of the color resist layer 16 facing away the base substrate 10, and the third insulating film may be exposed and developed using a gray tone mask. A part of the third insulating film may be removed at the position of the first via hole 21 to form the first via hole 21, and all the third insulating film is removed at the position of the second via hole 22 to form the second via hole 22, thereby forming the third insulating layer 17.

In an embodiment, after removing a part of the third insulating film in order to form the first via hole 21, the thickness of the material of the third insulating layer 17 at the first via hole 21 may range from 1.0 μm to 2.0 μm. That is, during the process of forming the third insulating layer on the side of the color resist layer facing away the base substrate, the thickness of the portion of the third insulating layer corresponding to the position of the first via hole ranges from 1.0 μm to 2.0 μm. For example, the thickness of the third insulating layer 17 at the position of the first via hole 21 may be one of 1.0 μm, 1.2 μm, 1.4 μm, 1.6 μm, 1.8 μm and 2.0 μm.

In an embodiment, an etching process is performed at the first via hole and the second via hole, so as to remove the third insulating layer and the second insulating layer remaining at the first via hole to expose the drain electrode in the source-drain metal layer, and remove the second insulating layer and the first insulating layer at the second via hole to expose at least a part of the gate metal layer, so that the first via hole extends to the drain electrode, and the second via hole extends to the gate metal layer. By way of example, the gate metal layer may include a common electrode line, and the second insulating layer and the first insulating layer at the second via hole are removed to expose at least a part of the common electrode line, so that the common electrode is lap-jointed on at least a part of the common electrode line.

In an embodiment, dry etching may be performed at the first via hole 21 and the second via hole 22 so as to remove the third insulating layer 17 and the second insulating layer 15 in the first via hole 21 to form a fifth via hole 25 in the third insulating layer 17 and the second insulating layer 15, so that the first via hole extends to the drain electrode, and remove the second insulating layer 15 and the first insulating layer 12 at the second via hole 22 to form a sixth via hole 26 in the second insulating layer and the first insulating layer, so that the second via hole extends to the common electrode line. The drain electrode 142 is exposed through the fifth via hole 25 (extended first via hole), and at least a part of the gate metal layer (for example, the common electrode line 112) is exposed through the sixth via hole 26 (extended second via hole), as shown in FIG. 12.

In the embodiment shown in FIGS. 11 and 12, during the process of forming the fifth via hole 25, the materials of the third insulating layer 17 and the second insulating layer 15 need to be etched away. Compared with the embodiment shown in FIGS. 1 and 2, the film layer etched for forming the fifth via hole 25 is thicker than that etched for forming the fifth via hole 25', so that the required etching time is increased. This shortens the difference between the time for etching the fifth via hole 25 and the time for etching the sixth via hole 26, which can avoid premature exposure of the drain electrode, prevent the drain electrode from being seriously oxidized, reduce the influence on the contact resistance at the fifth via hole, increase the product yield, and improve the product display effect.

Prior to forming the fifth via hole (i.e., prior to extending the first via hole), the thickness of the third insulating layer 17 at the first via hole 21 may range from 1.0 μm to 2.0 μm. As a result, when etching is performed at the first via hole, there is a small difference between the time required for etching away the third insulating layer 17 and the second insulating layer 15 and the time required for etching away the second insulating layer 15 and the first insulating layer 12, which can further avoid premature exposure of the drain electrode 142, prevent the drain electrode from being seriously oxidized at the fifth via hole, decrease the influence on the contact resistance at the fifth via hole, increase the product yield, and improve the product display effect.

In addition, compared with the method for manufacturing a display substrate shown in FIGS. 1 and 2, the method for manufacturing a display substrate according to the embodiments of the disclosure does not add additional masks and process steps or influence the cost, and can achieve mass production.

In the foregoing embodiment, the thin film transistor in the thin film transistor structure is of bottom gate structure. It can be understood that the technical solution of the embodiment of the present disclosure is also applicable to a thin film transistor of a top gate structure.

Based on the inventive concept of the foregoing embodiments, another embodiment of the disclosure provides a display substrate, which is manufactured using the manufacturing method according to the foregoing embodiments. The structure of the display substrate is as shown in FIG. 9. The display substrate may comprise a base substrate 10, a thin film transistor structure, a second insulating layer 15, a color resist layer 16 and a third insulating layer 17.

The thin film transistor structure is located on a side of the base substrate 10, and the thin film transistor structure may include a first insulating layer 12 and a source-drain metal layer. The second insulating layer 12 is located on a side of the thin film transistor structure facing away the base substrate 10. The color resist layer 16 is located on a side of the second insulating layer 15 facing away the base substrate 10. The third insulating layer 17 is located on a side of the color resist layer 16 facing away the base substrate 10.

The third insulating layer 17 includes a first via hole 21. The first via hole 21 sequentially penetrates the third insulating layer 17, the color resist layer 16, and the second insulating layer 15 and thus extends from the third insulating layer 17 to the source-drain metal layer to expose at least a part of the source-drain metal layer. By way of example, the first via hole 21 exposes the drain electrode 142.

As shown in FIG. 9, the sidewall of the first via hole includes a first portion b1 formed of the material of the second insulating layer, a second portion b2 formed of the material of the color resist layer, and a third portion b3 formed of the material of the third insulating layer. The second portion b2 is located between the first portion b1 and the third portion b3. Within the orthographic projection of the upper opening of the first via hole 21 on the base substrate 10, the orthographic projection of the third insulating layer 17 on the base substrate 10 falls within the orthographic projection of the color resist layer 16 on the base substrate 10. Therefore, there is no undercut between the third insulating layer 17 and the color resist layer 16, so that the sidewall of the first via hole 21 is smooth, which facilitates good contact between a metal film layer (for example, a pixel electrode layer) formed in the subsequent process and the drain electrode 142 through the first via hole 21.

In an embodiment, the thin film transistor structure further includes a gate metal layer between the source-drain metal layer and the base substrate. The third insulating layer further includes a second via hole 22, and the second via hole 22 sequentially penetrates the third insulating layer 17, the color resist layer 16, the second insulating layer 15 and a part of the first insulating layer and thus extends from the third insulating layer to the gate metal layer, thereby exposing at least a part of the gate metal layer. By way of example, the gate metal layer may include a common electrode line 112, and the second via hole 22 exposes at least a part of the common electrode line 112.

In an embodiment, the thickness of the color resist layer ranges from 1.0 μm to 2.0 μm, the thickness of the first insulating layer ranges from 3500 angstroms to 4500 angstroms, and the thickness of the second insulating layer ranges from 800 angstroms to 1200 angstroms.

In an embodiment, the display substrate further comprises a transparent electrode layer. The transparent electrode layer is located on a side of the third insulating layer 17 facing away the base substrate 10. The transparent electrode layer includes a pixel electrode 181 and a common electrode 182. The pixel electrode may extend along the sidewall of the first via hole to come into contact with the source-drain metal layer, for example, the pixel electrode 181 is connected to the source electrode 141 or the drain electrode 142 in the source-drain metal layer through the first via hole 21. The common electrode may extend along the sidewall of the second via hole 22 to come into contact with the gate metal layer, for example, the common electrode 182 is connected to the common electrode line 112 in the gate metal layer through the second via hole 22.

A further embodiment of the disclosure provides a display device comprising the display substrate in the foregoing embodiment. The display device may be any product or component with a display function, such as a mobile phone, a tablet computer, a television, a monitor, a notebook computer, a digital photo frame, a navigator, and so on.

In the description of this specification, it should be understood that the orientations or positional relations indicated by the terms such as "center", "longitudinal", "lateral", "length", "width", "thickness", "upper", "lower", "front", "rear", "left", "right", "vertical", "horizontal", "top", "bottom", "inner", "outer", "clockwise", "counterclockwise", "axial", "radial", "circumferential", and the like are based on the orientations or positional relations shown in the drawings, which are only for the convenience of describing the disclosure and simplifying the description, and do not indicate or imply an indicated device or element must have a specific orientation, or be constructed and operated in a specific orientation, and therefore cannot be construed as a limitation to the present disclosure.

In addition, the terms "first" and "second" are only used for descriptive purposes, and cannot be understood as indicating or implying relative importance or implicitly indicating the number of indicated technical features. Thus, the features defined with "first" and "second" may explicitly or implicitly include one or more of these features. In the description of the disclosure, "plurality" means two or more, unless specifically defined otherwise.

In the specification, unless expressly specified and defined otherwise, the terms such as "installation", "connected", "connection", "fixation", etc. should be understood broadly, for example, they can be fixed connection, detachable connection or integral connection; they can be mechanical connection, electrical connection or communication; they can be direct connection or indirect connection via an intermediate medium, or communication between two elements or interaction between two elements. Those ordinarily skilled in the art may understand the specific meanings of the above terms in the present disclosure based on specific situations.

In the specification, unless expressly specified and defined otherwise, the first feature being "on" or "under" the second feature may include the first feature being in direct contact with the second feature, and may also include the first feature and the second feature being not in direct contact but in contact with each other via another feature therebetween. Moreover, the first feature being "on", "above" and "over" includes the first feature being directly above and diagonally above the second feature, or it simply means that the level height of the first feature is larger than that of the second feature. The first feature being "under", "below" and "beneath" the second feature includes the first feature being directly below and diagonally below the second feature, or it simply means that the level height of the first feature is smaller than that of the second feature.

The above disclosure provides many different embodiments or examples for implementing different structures of the solutions. In order to simplify the specification, components and settings of specific examples are described above. Of course, they are only examples, and are not intended to limit the present disclosure. In addition, the present disclosure may repeat reference numerals and/or reference letters in different examples, and this repetition is for the purpose of simplification and clarity and does not indicate the relationships between the various embodiments and/or settings discussed.

What have been described are only specific embodiments of the disclosure, but the protection scope of the disclosure is not so limited. Any variations or substitutions that can be easily conceived by a skilled person familiar with this technical field shall be encompassed within the scope of the present disclosure. Thus, the protection scope of the disclosure shall be based on that of the claims.

The invention claimed is:

1. A method for manufacturing a display substrate, comprising:
    forming a thin film transistor structure on a base substrate, the thin film transistor structure comprising a gate metal layer, a first insulating layer, and a source-drain metal layer;
    forming a second insulating layer on a side of the thin film transistor structure facing away the base substrate;

forming a color resist layer and a third insulating layer successively on a side of the second insulating layer facing away the base substrate, the third insulating layer comprising a first via hole and a second via hole, wherein the first via hole penetrates the third insulating layer so that a material of the color resist layer is comprised between a bottom of the first via hole and the second insulating layer, and an orthographic projection of the first via hole on the base substrate at least partially overlaps an orthographic projection of the source-drain metal layer on the base substrate, the second via hole penetrates the third insulating layer and the color resist layer to expose a part of the second insulating layer, and an orthographic projection of the second via hole on the base substrate at least partially overlaps an orthographic projection of the gate metal layer on the base substrate; and performing an etching process in the first via hole and the second via hole, so that the first via hole penetrates the color resist layer and the second insulating layer, and extends to the source-drain metal layer to expose at least a part of the source-drain metal layer, and the second via hole extends to the gate metal layer to expose at least a part of the gate metal layer.

2. The method according to claim 1, wherein the forming the color resist layer and the third insulating layer successively on the side of the second insulating layer facing away the base substrate comprises:

forming the color resist layer on the side of the second insulating layer facing away the base substrate, the color resist layer comprising a third via hole, the third via hole exposing at least a part of the second insulating layer, and an orthographic projection of the third via hole on the base substrate at least partially overlapping an orthographic projection of the gate metal layer on the base substrate; and forming the third insulating layer on a side of the color resist layer facing away the base substrate, so that the first via hole exposes a part of the color resist layer, and the second via hole penetrates the third via hole to expose a part of the second insulating layer.

3. The method according to claim 2, wherein during a process of forming the color resist layer on the side of the second insulating layer facing away the base substrate, a portion of the color resist layer corresponding to the first via hole has a thickness ranging from 1.0 μm to 2.0 μm.

4. The method according to claim 1, wherein the etching process comprises a dry etching process employing an etching gas, the etching gas comprises nitrogen trifluoride and oxygen, and a volume ratio of nitrogen trifluoride to oxygen ranges from 1:1 to 1:3.

5. The method according to claim 1, wherein the source-drain metal layer comprises at least one of a source electrode and a drain electrode, and an orthographic projection of the first via hole on the base substrate at least partially overlaps an orthographic projection of the at least one of the source electrode and the drain electrode on the base substrate, so that the first via hole exposes at least a part of the at least one of the source electrode and the drain electrode.

6. The method according to claim 1, wherein the gate metal layer comprises a common electrode line, and an orthographic projection of the second via hole on the base substrate at least partially overlaps an orthographic projection of the common electrode line on the base substrate, so that the second via hole exposes at least a part of the common electrode line.

7. A method for manufacturing a display substrate, comprising:

forming a thin film transistor structure on a base substrate, the thin film transistor structure comprising a gate metal layer, a first insulating layer, and a source-drain metal layer;

forming a second insulating layer on a side of the thin film transistor structure facing away the base substrate;

forming a color resist layer and a third insulating layer successively on a side of the second insulating layer facing away the base substrate, the third insulating layer comprising a first via hole and a second via hole, wherein the first via hole does not penetrates the third insulating layer so that a material of the third insulating layer is comprised between a bottom of the first via hole and the second insulating layer, and an orthographic projection of the first via hole on the base substrate at least partially overlaps an orthographic projection of the source-drain metal layer on the base substrate, the second via hole penetrates the third insulating layer and the color resist layer to expose a part of the second insulating layer, and an orthographic projection of the second via hole on the base substrate at least partially overlaps an orthographic projection of the gate metal layer on the base substrate; and performing an etching process in the first via hole and the second via hole, so that the first via hole penetrates the third insulating layer and the second insulating layer, and extends to the source-drain metal layer to expose at least a part of the source-drain metal layer, and the second via hole extends to the gate metal layer to expose at least a part of the gate metal layer.

8. The method according to claim 7, wherein the forming the color resist layer and the third insulating layer successively on the side of the second insulating layer facing away the base substrate comprises:

forming the color resist layer on the side of the second insulating layer facing away the base substrate, the color resist layer comprising a third via hole and a fourth via hole, the third via hole and the fourth via hole exposing a portion of the second insulating layer, respectively, an orthographic projection of the third via hole on the base substrate at least partially overlapping an orthographic projection of the gate metal layer on the base substrate, and an orthographic projection of the fourth via hole on the base substrate at least partially overlapping an orthographic projection of the source-drain metal layer on the base substrate; and forming the third insulating layer on the side of the color resist layer facing away the base substrate, so that the first via hole does not penetrate the third insulating layer, and the second via hole penetrates the third insulating layer to expose a part of the second insulating layer.

9. The method according to claim 8, wherein during a process of forming the third insulating layer on the side of the color resist layer facing away the base substrate, a portion of the third insulating layer corresponding to the first via hole has a thickness ranging from 1.0 μm to 2.0 μm.

\* \* \* \* \*